(12) United States Patent
Nguyen et al.

(10) Patent No.: US 9,664,709 B2
(45) Date of Patent: May 30, 2017

(54) ELECTRICAL SENSOR WITH CONFIGURABLE SETTINGS

(75) Inventors: Huy D. Nguyen, Tracy, CA (US); Roger Borders, San Jose, CA (US)

(73) Assignee: NEILSEN-KULJIAN, INC., San Jose, CA (US)

( * ) Notice: Subject to any disclaimer, the term of this patent is extended or adjusted under 35 U.S.C. 154(b) by 348 days.

(21) Appl. No.: 13/492,752

(22) Filed: Jun. 8, 2012

(65) Prior Publication Data

US 2013/0328687 A1    Dec. 12, 2013

(51) Int. Cl.
*G01R 1/20* (2006.01)
*G08B 21/00* (2006.01)
*G01R 15/12* (2006.01)
*G01R 15/18* (2006.01)

(52) U.S. Cl.
CPC ......... *G01R 15/125* (2013.01); *G01R 15/183* (2013.01)

(58) Field of Classification Search
None
See application file for complete search history.

(56) References Cited

U.S. PATENT DOCUMENTS

| 4,297,587 | A | 10/1981 | Baker |
| 4,321,530 | A | 3/1982 | Kelly et al. |
| 4,346,307 | A | 8/1982 | Zulaski |
| 4,454,557 | A | 6/1984 | Hurley |
| 4,558,310 | A | 12/1985 | McAllise |
| 4,728,898 | A | 3/1988 | Staley, Jr. |
| 4,866,557 | A | 9/1989 | Fitts et al. |
| 5,179,495 | A | 1/1993 | Zuzuly |
| 5,450,268 | A | 9/1995 | Phillips et al. |
| 5,668,692 | A | 9/1997 | Rodgers et al. |
| 5,920,191 | A | 7/1999 | Maniero et al. |
| 5,995,347 | A | 11/1999 | Rudd et al. |
| 6,018,700 | A | 1/2000 | Edel |
| 6,043,641 | A | 3/2000 | Singer et al. |
| 6,118,270 | A | 9/2000 | Singer et al. |
| 6,141,198 | A | 10/2000 | Zuzuly |

(Continued)

FOREIGN PATENT DOCUMENTS

| EP | 1 970 716 A2 | 9/2008 |
| WO | 2013/184421 A1 | 12/2013 |
| WO | 2014/031688 A1 | 2/2014 |

OTHER PUBLICATIONS

International Search Report and Written Opinion in International Application No. PCT/US2013/042775, mailed Oct. 31, 2013.

(Continued)

*Primary Examiner* — Jermele M Hollington
(74) *Attorney, Agent, or Firm* — Nixon Peabody LLP

(57) ABSTRACT

An electrical sensor is described. The electrical sensor including an electrical signal input configured to receive an electrical signal, an alarm, one or more inputs configured to set a configuration value corresponding to one or more indicators on the electrical sensor, and monitor. The monitor is coupled with the electrical signal input, the alarm, and the one or more inputs. Further, the monitor is configured to determine a characteristic of the electrical signal received on the electrical signal input. And, the monitor is configured to activate the alarm based on the configuration value set by the one or more inputs and the characteristic of the electrical signal.

24 Claims, 7 Drawing Sheets

(56) References Cited

U.S. PATENT DOCUMENTS

| | | | |
|---|---|---|---|
| 6,147,847 | A | 11/2000 | Hochgraef et al. |
| 6,512,361 | B1 | 1/2003 | Becker |
| 7,310,049 | B2 | 12/2007 | Bowman |
| 7,615,989 | B2 | 11/2009 | Kojori |
| 7,742,273 | B1 | 6/2010 | Shvartsman et al. |
| 7,907,375 | B2 | 3/2011 | Blakely et al. |
| 2005/0017734 | A1 | 1/2005 | Gemme et al. |
| 2008/0017726 | A1 | 1/2008 | Neumann |
| 2009/0122453 | A1 | 5/2009 | Vicente et al. |
| 2009/0284250 | A1 | 11/2009 | Rittmann |
| 2009/0315568 | A1 | 12/2009 | Holce et al. |
| 2010/0001716 | A1 | 1/2010 | Serpinet et al. |
| 2010/0085036 | A1 | 4/2010 | Banting et al. |
| 2010/0308797 | A1 | 12/2010 | Zimmermann |
| 2012/0176120 | A1 | 7/2012 | Jefferies |
| 2014/0055151 | A1* | 2/2014 | Nguyen ................ 324/714 |
| 2014/0354439 | A1 | 12/2014 | Nguyen et al. |

OTHER PUBLICATIONS

Extended European Search Report in European Application No. 13831509.8, dated Aug. 6, 2015.
Extended European Search Report in European Application No. 13800640.8, dated Aug. 11, 2015.
International Search Report and Written Opinion in International Application No. PCT/US2013/055863, mailed Jan. 29, 2014.
Office Action in U.S. Appl. No. 13/591,130, mailed Aug. 29, 2014.
Office Action in U.S. Appl. No. 13/591,130, mailed Jan. 20, 2015.
Office Action in U.S. Appl. No. 13/591,130, mailed Jun. 8, 2015.
Office Action in U.S. Appl. No. 13/591,130, mailed Nov. 16, 2015.
Office Action in U.S. Appl. No. 13/591,130, mailed Feb. 26, 2016.
Office Action in U.S. Appl. No. 14/226,758, mailed Feb. 26, 2016.
Office Action in U.S. Appl. No. 13/591,130, mailed Sep. 23, 2016.
Office Action in U.S. Appl. No. 14/226,758, mailed Aug. 26, 2016.
NK Technologies, "ASXP Series Current Sensing Switches", http://www.nktechnologies.com/current-sensing-switch/asxp-current-switch.html (last visited Aug. 2012), p. 1.
NK Technologies, "ASXP Series Current Operated Switches", Rev. 7.12c, http://www.nktechnologies.com/current-sensing-switch/asxp-current-switch.html (last visited Aug. 2012), pp. A20-A21.
NK Technologies, "ASXP Instruction Sheet", Rev 4, 07-12 P/N 394100001, http://www.nktechnologies.com/current-sensing-switch/asxp-current-switch.html (last visited Aug. 2012), pp. 1-2.
Office Action in U.S. Appl. No. 14/226,758, mailed Feb. 15, 2017.

* cited by examiner

ELECTRICAL SENSOR WITH CONFIGURABLE SETTINGS

FIELD

Embodiments of the invention relate to electrical sensors. In particular, embodiments of the invention relate to electrical sensors that can be configured.

BACKGROUND

Electrical sensors are used to detect and monitor one or more characteristics of an electrical signal in a conductor. As such, electrical sensors can be used in systems to monitor current levels, voltage levels, power levels, or other aspects of an electrical system. Monitoring one or more electrical signals in an electrical system provides information on the operating conditions of the system, a subsystem, or one or more components in the system. For example, an electrical sensor may be used in control systems in manufacturing and industrial applications. In such applications, an electrical sensor may be used to monitor equipment status, to detect process variations, and to ensure safety of personnel. In addition, an electrical sensor may be used to control pumps, compressors, heaters, conveyors, and other electrically powered devices.

Some electrical sensors are equipped with an alarm that is activated upon the detection of certain operation conditions. The problem with present electrical sensors is that the electrical sensors have a limited dynamic range. In other words, the present electrical sensors are limited to a narrow range between the minimum and the maximum values that can be measured. As such, present electrical sensors are limited to specific applications or systems that have to be specifically designed to accommodate the limited range of electrical sensors.

The high cost of the systems and its individual components as well as the high power used for operating the systems require that the system be shut down to ensure the safety of the equipment and the technician when adjustments are made. In addition, the use of an electrical sensor at the upper and lower ends of a selected operating range creates reliability and accuracy problems. For example, operating an electrical sensor too close to its minimum rated value will not accurately measure values. There is a similar problem operating an electrical sensor too close to the upper limit of an operating range. Because of the problem of accurately monitoring currents at or near the extremes of an operating range, the safety of equipment and personnel may be jeopardized. Further, the limited operating range of an electrical sensor restricts the use to specific systems or applications. In addition, once the electrical sensors have been manually adjusted, the present electrical sensors must be recalibrated. The recalibration requires shutting a system down to adjust manually the electrical sensor, and turning the system back on to verify that the sensor had been adjusted properly. This is repeated until the electrical sensor is properly configured. Alternatively, the electrical sensor can be calibrated off site but the system still must be shut down to reinstall the electrical sensor and must again be verified it is configured properly, which includes turning the system back on and if necessary shutting it down again to reconfigure the electrical sensor. Such a process of adjusting and recalibrating present electrical sensors creates extended down time for a system and adds to the cost of running the system.

SUMMARY

An electrical sensor is described. The electrical sensor including an electrical signal input configured to receive an electrical signal, an alarm, one or more inputs configured to set a configuration value corresponding to one or more indicators on the electrical sensor, and monitor. The monitor is coupled with the electrical signal input, the alarm, and the one or more inputs. Further, the monitor is configured to determine a characteristic of the electrical signal received on the electrical signal input. And, the monitor is configured to activate the alarm based on the configuration value set by the one or more inputs and the characteristic of the electrical signal.

Other features and advantages of embodiments of the present invention will be apparent from the accompanying drawings and from the detailed description that follows.

BRIEF DESCRIPTION OF THE DRAWINGS

Embodiments of the present invention are illustrated by way of example and not limitation in the figures of the accompanying drawings, in which like references indicate similar elements and in which.

DETAILED DESCRIPTION

Embodiments of an electrical sensor are described. In particular, an electrical sensor is described that is configured to operate over a wide dynamic range. In addition, embodiments of an electrical sensor are configured to enable setting a trip point of an alarm based on visual indicators without the need to calibrate the electrical sensor or verify the setting. According to an embodiment, an electrical sensor dynamically adjusts its operating ranged based on the set value of a trip-point setting. For another embodiment, an electrical sensor dynamically adjusts its operating range based on the measured magnitude of an electrical signal, such as, a current level, a voltage level and/or a power level. As such, embodiments of the electrical sensor can operate over a wide dynamic range. In other words, embodiments of the electrical sensor may be configured and may adapt to measure the electrical characteristic of a signal over a large range of values.

In addition to providing the benefit of being able to operating over a large range of values, embodiments of the electrical sensor offer the benefit of not needing to be manually recalibrated when configuration adjustments are made. The electrical sensor, according to embodiments, includes user inputs, such as configuration inputs, to select the value of one or more settings such as the trip point for an alarm and the delay time of the alarm based on indicators located on the electrical sensor. As such, a user may select the desired setting without the need to recalibrate or to verify that the configuration settings are at the desired value. This reduces the labor necessary to install or configure such a device. Thus, the features of embodiments of the electrical sensor provide ease of use, cost savings, and time savings over prior art sensors.

Figure 1:
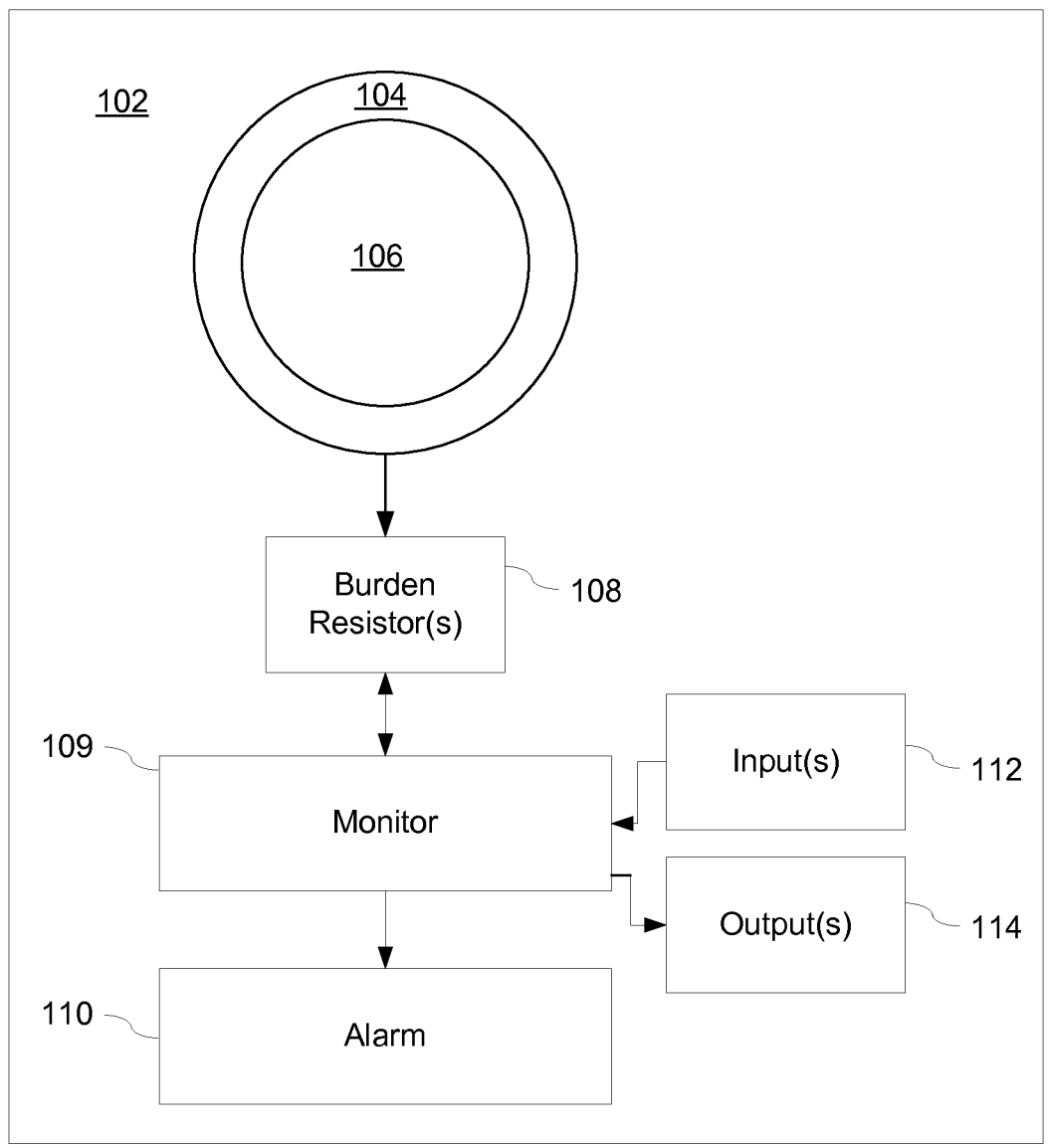
FIG. 1 illustrates a block diagram of a current sensor according to an embodiment.

Embodiments of an electrical sensor include, but are not limited to, a current sensor, a voltage sensor, a power sensor, and other sensors for measuring or determining characteristics of an electrical signal. Examples of such characteristics of an electrical signal include, but are not limited to, magnitude of a current or a voltage, polarity, average magnitude of a current or a voltage during a period of time, peak magnitude of a current or a voltage over a period of time, minimum magnitude of a current or a voltage during a period of time, or other aspects of an electrical signal. Such electrical sensors include, but are not limited to, automation sensors, industrial sensors, and control sensors. According to an embodiment an electrical sensor includes an electrical signal input configured to receive an electrical signal to monitor. Examples of an electrical signal input includes, but are not limited to, a core, a voltage transformer, a resistive shunt, and other methods to electrically couple with an electrical conductor. FIG. 1 illustrates a block diagram of a current sensor according to an embodiment. Current sensor 102, according to an embodiment, includes a core 104. For an embodiment, a core 104 is made from a magnetically permeable material. For example, a core 104 may be made from ferromagnetic metals, such as iron, ferromagnetic compounds, or other material having a magnetic permeability. According to an embodiment, a core 104 is configured to form a toroid or other shape such that the core 104 defines a sensing aperture 106. A core 104 may be any shape that acts to guide magnetic fields generated by an electrical conductor located in the sensor aperture 106 defined by the core 104.

A core 104, according to an embodiment, is configured such that an electrical conductor may pass through a sensing aperture 106. For some embodiments, a core 104 may be a solid core. That is, the core 104 is one piece such that an electrical conductor can be threaded through a sensor aperture 106. Another embodiment includes a core 104 that is a split core, such that the core 104 may be separated to allow an electrical conductor to be placed within a sensor aperture 106.

A current in an electrical conductor is known to generate a magnetic field. A core 104 acts to magnify a magnetic field generated by an electrical conductor situated in a sensing aperture 106. According to an embodiment, a core 104 may be a wire-wound core. Such a wire-wound core may be used to sense or measure alternating current ("AC") in an electric conductor. For such an embodiment, an electrical conductor generates an alternating magnetic field. A core 104 acts to magnify an alternating magnetic field generated by an electrical conductor. The alternating magnetic field confined in the core 104 generates a current in the wire wound around the wire-wound core. This current can then be used to measure or determine characteristics of a current in an electrical conductor passing through a sensor aperture 106. Characteristics of an electrical signal that can be measured or determined include, but are not limited to, frequency, harmonics, or other characteristics of the electrical signal that can be derived from a current value.

According to an embodiment, the wire-wound core in combination with an electrical conductor passing through a sensor aperture 106 acts as a transformer. As such, the current generated in the wire wound around the wire-wound core is proportional to the current in the electrical conductor according to principles known in the art with regards to transformers. Thus, a current in the electrical conductor passing through the sensor aperture 106, a primary current, may be determined using the corresponding current generated in the wire wound around the wire-wound core, a secondary current. The primary current may be determined by multiplying the secondary current by a multiplication constant. The multiplication constant is determined, as is known in the art, by the characteristics of a core and a number of windings around the core. Alternatively, a multiplication constant may be determined empirically. For example, a primary current, can be generated in an electrical conductor passing through a sensor aperture 106 and the corresponding secondary current generated in the wire wound around the wire-wound core may be measured. As such, a multiplication constant may be used that is equal to or based on the ratio of the primary current to the secondary current.

For some embodiments, a core 104 may include a hall-effect sensor. A core 104 including or coupled with a hall-effect sensor is used to measure or determine a current, either AC or direct current ("DC"), in an electrical conductor passing through a sensor aperture 106. As described above, a core 104 acts to magnify the magnetic field generated by the electrical conductor. The magnetic field confined within the core 104 passes through the hall-effect sensor which generates a voltage that may be used to measure or determine characteristics of the current in the electrical conductor passing through a sensor aperture 106 using techniques known in the art.

As illustrated in FIG. 1, a current sensor 102 includes a burden resistor(s) 108 coupled with a core 104. According to an embodiment, a burden resistor(s) 108 is a circuit that includes one or more resistors. The one or more resistors are configured such that the resistance of the burden resistor(s) circuit may be changed. For some embodiments, one or more resistors may be electrically coupled with the circuit through one or more switches or relays. For such an embodiment, one or more switches may be used to add one or more resistors in series to add more resistance to the circuit. According to another embodiment, the one or more switches may be used to add one or more resistor in parallel to reduce the resistance of the circuit.

The embodiment illustrated in FIG. 1 also includes a monitor 109. For an embodiment, a monitor 109 is a circuit configured to determine the magnitude of a current in an electrical conductor passing through a sensor aperture 106. A monitor 109 includes one or more control signals, according to an embodiment. One or more control signals, according to an embodiment, are coupled with one or more switches included with a burden resistor(s) 108. According to an embodiment, a monitor 109 is configured to use one or more control signals to activate one or more switches to add one or more resistors to a circuit of burden resistor(s) 108 as the sensed or the determined magnitude of the current in the electrical conductor increases. For another embodiment, a monitor 109 is configured to use one or more control signals to activate the one or more switches to add one or more resistors to a circuit of a burden resistor(s) 108 as the sensed or the determined magnitude of the current in the electrical conductor decreases. A monitor 109, according to an embodiment, may be configured to use to activate one or more switches of a burden resistor(s) 108 based on an average value of the determined magnitude of the current over a period of time. According to an embodiment, one or more control signals may be a voltage, a current, a bit stream, or other signal that can be used to activate a switch.

A burden resistor(s) 108, according to an embodiment, may also include other components in the circuit. For example, a burden resistor(s) 108 may include, but is not limited to, diodes, capacitors, amplifiers, rectifiers or other components to further condition a signal. According to an embodiment, a burden resistor(s) 108 coupled with a wire-wound core includes, but is not limited to, a rectifier, such as a half-wave rectifier, full-wave rectifier, or other type of rectifier as is known in the art. As such, a burden resistor(s) 108 generates an output signal conditioned for monitor 109 to determine the magnitude of the current in the electrical conductor passing through a sensor aperture 106, according to an embodiment. The output signal generated by a burden resistor(s) 108, according to an embodiment, may include a current or a voltage that corresponds to the current in the electrical conductor.

A monitor 109 may also include a conditioning circuit to conditioning a signal received from a burden resistor(s) 108. The conditioning circuit may include components including, but not limited to, amplifiers, diodes, resistors, capacitors or other components used alone or in combination to shape, transform, or otherwise alter a signal. For some embodiments, a monitor 109 may include a conditioning circuit in addition to or instead of one or more components in burden resistor(s) 108 for signal conditioning. According to an embodiment including a wire-wound coil, a monitor 109 includes one or more components that act as a current-to-voltage convertor to transform a current output signal from a burden resistor(s) 108 into a voltage. This voltage can then be used by a monitor 109 to determine the current in the electrical conductor passing through a sensing aperture 106.

For an embodiment, a monitor 109 includes a conditioning circuit that includes components to scale a signal received from a burden resistor(s) 108. For example, the conditioning circuit may expand a voltage range or current range of the signal received from a burden resistor(s) 108. Another example includes a conditioning circuit that includes components to compress a voltage range or current range of a signal.

According to an embodiment, a monitor 109 generates one or more outputs 114. One such output 114 includes generating a current output signal that corresponds to the current in the electrical conductor threaded through a sensor aperture 106. According to an embodiment, monitor 109 may generate a current output signal from the output signal from a burden resistor(s) 108 using one or more conditioning circuits such as those described herein. For an embodiment, a monitor 109 generates a current output that corresponds to the determined magnitude of a current in an electrical conductor passing through a sensor aperture 106. Another embodiment includes a voltage output that corresponds to the determined magnitude of a current in an electrical conductor passing through a sensor aperture 106.

A monitor 109 may also generate a digital output signal, according to some embodiments. Such a digital output signal may include information formatted into one or more bits. For an embodiment, one or more bits may be combined to correspond to one or more binary numbers. According to an embodiment, a monitor 109 is configured to convey information about a current in an electric conductor passing through a sensor aperture 106 and/or information determined from the current. Examples of such information include, but are not limited to, characteristics of the current such as magnitude, polarity, average magnitude during a period of time, peak magnitude over a period of time, minimum magnitude during a period of time, or other aspects of the current. Examples of information determined from the current include, but are not limited to, frequency, harmonics, or other characteristics that can be determined from a current.

As illustrated in FIG. 1, a monitor 109 is coupled with an alarm 110. According to an embodiment, an alarm 110 is a circuit configured to generate an indication that the current in an electrical conductor passing through a sensor aperture 106 is at or has passed a threshold. According to an embodiment, monitor 109 determines a threshold is met or is passed if the magnitude of a current in the electrical conductor passing through the sensor aperture 106 is greater than or equal to a set threshold value. Upon such a determination the monitor activates an alarm 110, according to an embodiment. A monitor 109 may also activate an alarm 110 upon determining that the magnitude of a current in the electrical conductor is at a threshold value or less than the threshold value, for an embodiment.

An alarm 110 may include, but is not limited to, a visual indicator, an audible indicator, and an electrical indicator. Examples of a visual indicator include, but are not limited to, an LED, a display, a lamp and other visual indicators that can be visually perceived. Audible indicators may include, but are not limited to, a buzzer, a chime, a bell, and other indictors audibly perceived. Examples of an electrical indicator include, but are not limited to, generating a voltage or a current, activating a relay, switching a voltage or current from one level to another, driving a signal line to a voltage level or current level, and other indications that can be detected electrically.

For an embodiment, an alarm 110 may be an electrical signal used as a control signal. For example, an alarm 110 may be used to as part of a control system. As such, the alarm 110 may be used to stop, start, or control the rate of a process or system. According to an embodiment, one or more outputs 114 may be used as a part of control system. For example, a current output that corresponds to a current passing through a sensor aperture 106 may be used to control the rate of a process or system.

For an embodiment, current sensor 102 may include one or more inputs 112. One or more inputs 112, according to an embodiment, may be coupled to a monitor 109. An input(s) 112, such as a configuration input, may be configured to adjust the operation of a current sensor 102, according to an embodiment. For an embodiment, one or more configuration inputs include one or more adjustments to configure the operation of a current sensor 112. According to an embodiment, one or more configuration inputs are configured to select a threshold value or a trip-point value for an alarm 110. One or more configuration input may also select a delay value. For an embodiment, a delay value configures a period of time a current sensor 102 will delay the activation of an alarm after a threshold value or a trip-point value is met or passed. An input(s) 112 includes, but is not limited to, dials, switches, keypads, communication interfaces, or other interfaces.

According to an embodiment, a monitor 109 is configured to use one or more control signals to activate one or more switches included in a burden resistor(s) 108 based on a value selected by one or more inputs 112. For an embodiment, a monitor 109 is configured to activate one or more switches included in a burden resistor(s) 108 based on input(s) 112 configured to select a trip-point value for an alarm 110. As such, monitor 109 is configured to determine a value set by input(s) 112 used to select a trip-point value. Based on the determined trip-point value, a monitor 109 activates one or more switches to configure the resistance value for a burden resistor(s) 108, according to an embodiment.

Figure 2:
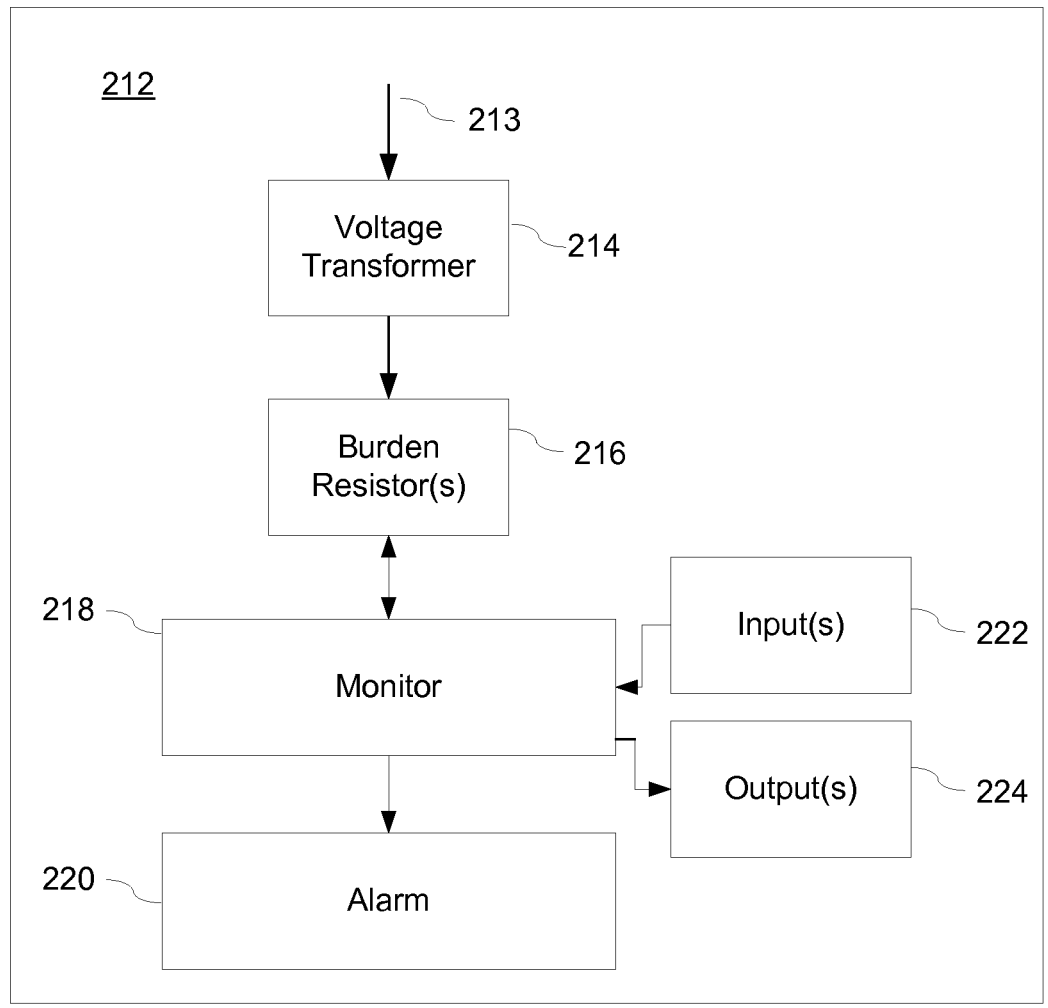
FIG. 2 illustrates a block diagram of a voltage sensor according to an embodiment.

FIG. 2 illustrates a voltage sensor 212 according to an embodiment. As illustrated in FIG. 2, an embodiment of a voltage sensor 212 includes a voltage transformer 214. A voltage transformer 214, according to an embodiment, is configured to receive an input voltage signal 213. The input voltage signal 213, according to an embodiment, is voltage for monitoring and may be a DC, an AC, or a three-phase voltage signal. According to an embodiment, a voltage transformer 214 is configured to convert an input voltage signal 213 to another voltage. For an embodiment, a voltage transformer 214 is a step-down transformer. Such a step-down transformer is configured to transform the input voltage signal 213 to a lower voltage that corresponds to the input voltage signal 213. Another embodiment includes a step-up transformer to transform the input voltage signal 213 to a higher voltage that corresponds to the input voltage signal 213. A voltage transformer 214 may be any type of voltage transformer, such as an electromagnetic voltage transformer.

According to an embodiment, a voltage transformer 214 is an electromagnetic transformer implemented using a wire-wound transformer, as is known in the art. For example, a voltage transformer 214 may be a wire-wound core, as described herein, including an input voltage signal 213 coupled with a primary winding wound around a magnetically permeable material, such as those described herein. The wire-wound core includes a secondary winding wound around the magnetically permeable material such that the transformer generates a second voltage proportional to the input voltage signal 213 on the secondary winding, as is known in the art. For such an embodiment, the secondary voltage is proportional and may be determined using a multiplication constant, as described herein. For an embodiment, the secondary voltage corresponds to the ratio of the number of turns in the second winding to the number of turns in the primary winding, as is known in the art. As such, the secondary voltage would be equal to an input voltage signal 213 multiplied by the number of turns in the secondary winding divided by the number of turns in the primary winding, according to an embodiment. For another embodiment, a multiplication constant may be determined empirically by generating an input voltage signal 213 having known characteristics and measuring the characteristics of the secondary voltage, similar to techniques described herein with regard to current. An embodiment includes a voltage transformer 214 configured to generate an output current that is proportional to the input voltage signal 213, for example by using techniques described herein for converting a voltage to a current. According to an embodiment, a voltage transformer 214 includes a hall-effect sensor, as described herein, when the voltage transformer 214 is configured to receive a DC input voltage signal. A voltage sensor 212 is configured to measure or determine an input voltage signal 213 from 0 volts to 600 volts, according to an embodiment. Another embodiment includes a voltage sensor 212 configured to measure an input voltage signal 213 from 0 volts to 150 volts. Yet another embodiment includes a voltage sensor 212 configured to measure an input voltage signal 213 greater than 600 volts. As such, one skilled in the art would understand embodiments of a voltage sensor 212 include those configured to measure an input voltage signal 213 over any range of voltages.

For some embodiments, a voltage sensor 212 includes a burden resistor(s) 216 coupled with a voltage transformer 214. Burden resistor(s) 216 is configured according to embodiments including, but not limited to, those described herein. As such, an embodiment of a burden resistor(s) 216 includes one or more resistors configured such that a resistance of the burden resistor circuit may be changed, for example, by using techniques described herein. For some embodiments, a burden resistor(s) 216 may be coupled to a voltage transformer 214 through one or more components, such as those described herein. In addition, a burden resistor(s) 216 may, according to an embodiment, include components other than resistive components, such as those described herein. An output signal generated by a burden resistor(s) 216, according to an embodiment, may include a current or a voltage that corresponds to an input voltage signal 213.

The embodiment of a voltage sensor 212 as illustrated in FIG. 2 also includes a monitor 218 coupled with a burden resistor(s) 216. A monitor 218 may be configured according to embodiments described herein. As such, a monitor 218, according to an embodiment, may include a conditioning circuit, such as those described herein. For an embodiment, a monitor 218 is configured to receive an output voltage from a burden resistor(s) 216. According to an embodiment, a monitor 218 is configured to determine the magnitude of an input voltage signal 213 using an output voltage from a burden resistor(s) 216, for example, by using techniques described herein.

A monitor 218 is configured to generate one or more outputs 224, such as using techniques described herein. For example, a monitor 218 may generate a current output signal from an output signal from a burden resistor(s) 216 using one or more conditioning circuits such as those described herein. For an embodiment, a monitor 218 generates a current output that corresponds to a determined magnitude of the input voltage signal 213, for example, by using techniques described herein. One or more outputs 224 may include one of or a combination of a voltage signal, a current signal, and a digital signal that corresponds to the input voltage signal 213 that is generated by monitor 218, such as using techniques described herein.

As in the embodiment illustrated in FIG. 2, a monitor 218 is coupled with an alarm 220. An alarm 220, according to an embodiment, is a circuit configured to generate an indication that an input voltage signal 213 is at or has passed a threshold, for example, by using techniques described herein. As such, an embodiment includes a monitor 218 configured to activate an alarm 220 upon determining the magnitude of an input voltage signal 213, such as using techniques described above. An alarm 220, according to an embodiment, may include any of the indicators or electrical signals as described herein. For example, an embodiment includes a relay, such as those described herein, that is configured to be activated by a monitor 220, using techniques described herein.

FIG. 2 also illustrates an embodiment including one or more inputs 222 coupled with a monitor 218, such as those described herein. For example, an embodiment includes one or more inputs 222, such as one or more configuration inputs, to configure an operation of a voltage sensor 212. According to an embodiment, one or more inputs 222 are configured to select one of or a combination of a trip-point value, a threshold value, and a delay value for alarm 220, for example, by using techniques described herein. One or more inputs 222 include those described herein, such as dials, switches, keypads, communication interfaces, or other interfaces.

An embodiment of a voltage sensor 212 includes a monitor 218 configured to change a resistance of a burden resistor(s) 216 through one or more control signals, using techniques described herein. For example, a monitor 218 is configured to activate or select one or more switches using one or more control signals based on a determined value of an input voltage signal 213, for example, by using techniques describe herein. Another embodiment, includes a voltage sensor 212 including a monitor 218 configured to change a resistance of a burden resistor(s) 216 based on a value set by one or more inputs 222, using techniques described herein. One example includes, a monitor 218 configured to determine a trip-point value selected by one or more inputs 222 and based on the determined value using one or more control signals to configured the resistance of a burden resistor(s) 216 using techniques described herein.

Figure 3:
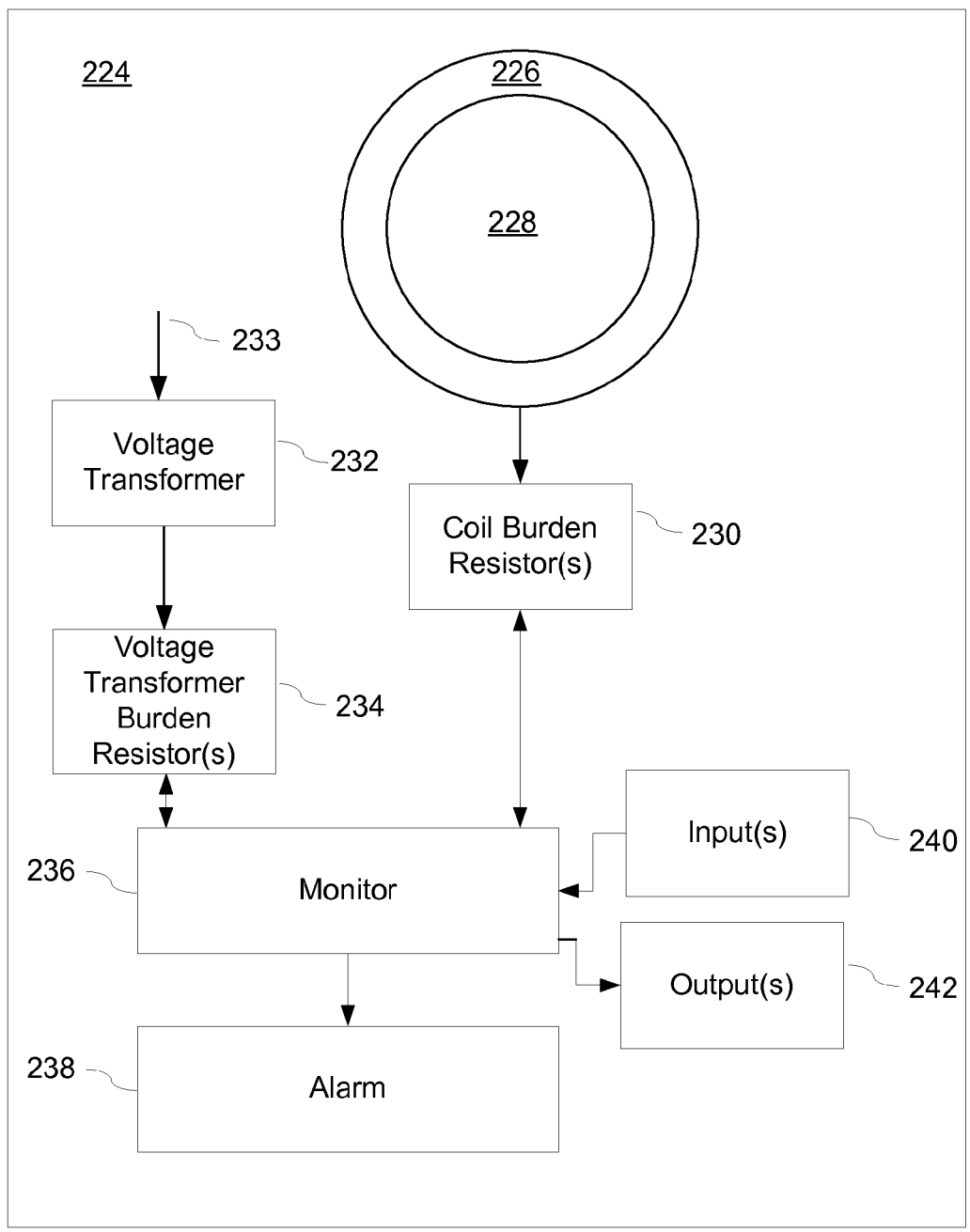
FIG. 3 illustrates a block diagram of a power sensor according to an embodiment.

FIG. 3 illustrates an embodiment of a power sensor 224 according to an embodiment. A power sensor 224, according to an embodiment, includes a core 226 configured to define a sensing aperture 228. Such a core 226 includes cores as described herein for sensing or measuring a current in an electrical conductor passing through a sensing aperture 228. For some embodiments, a power sensor 224 includes a coil burden resistor(s) 230 coupled with a coil 226, such as using techniques described herein. For an embodiment, a core 226 may be external to power sensor 224 and may be electrically coupled with a coil burden resistor(s) 230, for example, through one or more electrical conductors. Coil burden resistor(s) 230, according to an embodiment, is configured such as other burden resistor(s) described herein. As such, an embodiment of a coil burden resistor(s) 230 includes one or more resistors configured such that resistance of a burden resistor circuit may be changed, for example, by using techniques described herein. For some embodiments, burden resistor(s) 230 may be coupled to a core 226 through one or more components, such as those described herein. In addition, coil burden resistor(s) 230 may, according to an embodiment, include components other than resistive components, such as those described herein. An output signal generated by a coil burden resistor(s) 230, according to an embodiment, may include a current or a voltage that corresponds to a current in an electrical conductor passing through a sensing aperture 228.

According to an embodiment as illustrated in FIG. 3, a power sensor 224 includes a voltage transformer 232. A voltage transformer 232, according to an embodiment, is configured to receive an input voltage signal 233, such as described herein. As illustrated in FIG. 3, an embodiment of a power sensor 224 includes a voltage transformer 232 coupled with a voltage transformer burden resistor(s) 234. For an embodiment, a voltage transformer 232 may be external to power sensor 224 and may be electrically coupled with a voltage transformer burden resistor(s) 234, for example, through one or more electrical conductors. A voltage transformer burden resistor(s) 234 may be configured according to other burden resistor(s) described herein.

As such, an embodiment of a voltage transformer burden resistor(s) 234 includes one or more resistors configured such that resistance of the burden resistor circuit may be changed, for example, by using techniques described herein. As described above, voltage transformer burden resistor(s) 234 may be coupled to a voltage transformer 232 through one or more components, such as those described herein. In addition, a voltage transformer burden resistor(s) 234 may, according to an embodiment, include components other than resistive components, such as those described herein. The output signal generated by a voltage transformer burden resistor(s) 234, according to an embodiment, may include a current or a voltage that corresponds to an input voltage signal 233.

An embodiment of a power sensor 224 as illustrated in FIG. 3 also includes a monitor 236 coupled with a coil burden resistor 230 and a voltage transformer burden resistor(s) 234. A monitor 236 may be configured according to an embodiment of an electrical sensor as described herein. As such, a monitor 236, according to an embodiment, may include a conditioning circuit, such as those described herein. For an embodiment, a monitor 236 is configured to receive a coil output voltage from a coil burden resistor(s) 236 and a transformer output voltage from a voltage transformer burden resistor(s) 234. According to an embodiment, a monitor 236 is configured to determine a magnitude of an input signal voltage 233 using a transformer output voltage, for example, by using techniques described herein. Monitor 236, for an embodiment, is also configured to determine a magnitude of a current in an electrical conductor passing through a sensing aperture 228 using techniques as described herein.

A monitor 236, according to an embodiment, is configured to generate one or more outputs 224, for example, by using techniques described herein. For example, a monitor 236 may generate one of or a combination of a first current output signal based on an output signal from a coil burden resistor(s) 230 and a second current output signal based on an output signal from a voltage transformer burden resistor(s) 234. According to an embodiment, a monitor 236 may generate one or more output signals using one or more conditioning circuits such as those described herein. For an embodiment, a monitor 236 generates a current output that corresponds to a determined magnitude of an input voltage signal 233, for example, by using techniques described herein. A monitor 236, according to an embodiment, also generates a current output that corresponds to a determined magnitude of a current in an electrical conductor passing through a sensing aperture 228, for example, by using techniques described herein.

For an embodiment, monitor 236 is configured to determine a power level based on an input voltage signal 223 and a current in an electrical conductor passing through a sensor aperture 228. A monitor 236, according to an embodiment is configured to determine a power level based on a determined magnitude of a current in an electrical conductor and a determined magnitude of an input voltage signal 233. For an embodiment, monitor 236 is configured to determine a magnitude of power by multiplying a determined magnitude of a current in an electrical conductor by a determined magnitude of an input voltage signal 233 that corresponds to the determined current according to Joule's law. One skilled in the art would appreciate a power sensor 224 may be configured to use one or more other values to determine a power level using calculation methods based on combining Joule's law and Ohm's law. As such, a monitor 236, according to an embodiment, is configured to generate a current output that corresponds to the determined magnitude of power, for example, by using techniques described herein. In addition, one or more outputs 242 may include one of or a combination of a voltage signal, a current signal, and a digital signal that corresponds to one or more of the determined values generated by a monitor 236, such as using techniques described herein.

As in the embodiment illustrated in FIG. 3, a monitor 236 is coupled with an alarm 238. An alarm 238, according to an embodiment, is a circuit configured to generate an indication that a determined value, such as a determined voltage, a determined current, and/or a determined power, is at or has passed a threshold, for example, by using techniques described herein. As such, an embodiment includes a monitor 234 configured to activate an alarm 238 based upon determining a magnitude of one or more of the determined values, such as using techniques described herein. An alarm 238, according to an embodiment, may include any of the indicators or electrical signals as described herein. For example, an embodiment includes a relay, such as those described herein, that is configured to be activated by a monitor 236, using techniques described herein.

FIG. 3 also illustrates an embodiment including one or more inputs 240 coupled with a monitor 236, such as those described herein. For example, an embodiment includes one or more inputs 240, such as one or more configuration inputs, to configure an operation of a power sensor 224. According to an embodiment, one or more inputs 240 are configured to select one of or a combination of a trip-point value, a threshold value, and a delay value for alarm 238, for example, by using techniques described herein. One or more inputs 240 include those described herein, such as dials, switches, keypads, communication interface, or other interfaces.

An embodiment of a power sensor 224 includes a monitor 236 configured to change a resistance of one or both of a voltage transformer burden resistor(s) 234 and coil burden resistor(s) 230 through one or more control signals, using techniques described herein. For example, a monitor 236 is configured to activate one or more switches to configure a resistance for a voltage transformer burden resistor(s) 234 using one or more control signals based on a determined value of an input voltage signal 233, for example, by using techniques describe herein. Similarly, a monitor 236, according to an embodiment, is configured to activate one or more switches to configure a resistance for a coil burden resistor(s) 230 using one or more control signals based on a determined value of a current, for example, by using techniques describe herein.

Another embodiment, includes a power sensor 224 including a monitor 236 configured to change a resistance of one of or a combination of a coil burden resistor(s) 230 and a voltage transformer burden resistor(s) 234 based on a value set by one or more inputs 242, using techniques described herein. One example includes, a monitor 236 configured to determine a trip-point value selected by one or more inputs 234 and based on the determined trip-point value using one or more control signals to configure a resistance of one of or a combination of a coil burden resistor(s) 230 and a voltage transformer burden resistor(s) 234 using techniques described herein.

According to an embodiment, a power sensor 224 is configured to determine or derive other information based on one of or a combination of a determined value of a current and a determined value of an input voltage signal 233. Examples of information determined by a power sensor include, but are not limited to, power dissipation, average power during a period of time, minimum power during a period of time, maximum power during a period of time, or other information that may be determined one of or a combination of current values and voltage values. For an embodiment, an electrical sensor, such as a current sensor, a voltage sensor, and a power sensor, may be configured to store one or more determined values in a memory. Such determined values may be accessed by one or more outputs based on a command or a signal received on one or more inputs according an embodiment of an electrical sensor. In addition, an embodiment of an electrical sensor may include power components configured to power one or more components used in the electrical sensor.

Figure 4:
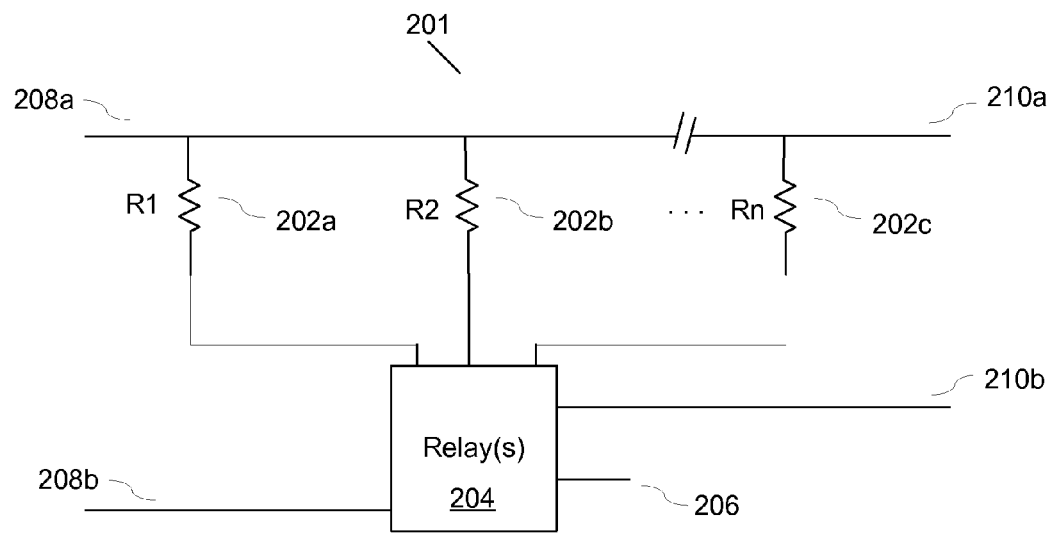
FIG. 4 illustrates a diagram of a burden resistor circuit for an electrical sensor according to an embodiment.

FIG. 4 illustrates a block diagram of a burden resistor circuit 201 for implementing a burden resistor of an electrical sensor according to an embodiment. For such an embodiment, resistive elements 202a-c are coupled with each other in parallel. Resistive elements 202a-c include, but are not limited to, one of or a combination of one or more fixed resistors, one or more potentiometers, and one or more rheostats. As such, resistive element 202a, for example, may be a single fixed resistor or a combination of one or more fixed resistors and a potentiometer to achieve a resistance R1 or R2. For an embodiment, the values of the resistive elements 202a-c are chosen to minimize the amount of heat generated by the resistive elements 202a-c when such a sensor is in use.

According to an embodiment, resistive elements 202a-c are coupled with one or more relays 204. The relays 204 are configured to switch resistive elements 202a-c in or out of the burden resistor circuit 201 to change the total resistance of the circuit. In other words, the relays 204 are used to electrically connect or disconnect resistive elements 202a-c to the circuit to change the overall resistance of the circuit.

As illustrated in FIG. 4, a relay(s) 204 includes one or more control signals 206. For embodiments, each relay includes one or more control signals 206. Other embodiments include a plurality of relays 204 using the same control signals 206 such as a parallel or serial bus. According to an embodiment, relay(s) 204 are coupled with a monitor through control signals 206. As such, a monitor uses the one or more control signals 206 to switch or to activate one or more relays 204 to connect or disconnect the resistive elements 202a-c to the circuit. For an embodiment, burden resistor circuit 201 is configured to have three resistance levels. Other embodiments include burden resistor circuit 201 with any number of resistance levels. As such, a monitor may use one or more relays to switch among the one or more resistance levels to change the total resistance of the circuit.

For an embodiment, each resistance level corresponds to a range of current, voltage, and/or power magnitudes. For an embodiment of a current sensor or a power sensor using three resistance levels, the first resistance level is for measuring a current having a magnitude less than 150 amperes, the second resistance level is for measuring a current having a magnitude of 150 amperes up to 300 amperes, and the third resistance level is for measuring current levels greater than 300 amperes. According to an embodiment, a burden resistor(s) for an electrical sensor is configured such that the total resistance of the circuit is equivalent to approximately 14 ohms when the first resistive level is selected, equivalent to approximately 7 ohms when the second resistance level is selected, and equivalent to approximately 2 ohms when the third level is selected. Such an embodiment is exemplary and other embodiments include using any number of resistance levels to configure an electrical sensor to operate over any range of current magnitudes.

For an embodiment, an electrical sensor such as a current sensor or a power sensor may be configured to measure current magnitudes over a range of 40 amperes to 200 amperes. According to another embodiment, a current sensor or a power sensor may be configured to measure current over a range of 60 amperes to 1200 amperes. For yet another embodiment, a current sensor or a power sensor may be configured to measure current of a range of 0 to 1200 amperes. Other embodiments include a current sensor or a power sensor configured to measure a current above 1200 amperes. As such, embodiments of a current sensors and a power sensor may be configured to measure a current in an electrical conductor over a variety of ranges. Similarly, a voltage sensor may include a burden resistor circuit 201 configured to operate over many different ranges of voltage magnitudes.

A burden resistor circuit 201 also includes, according to an embodiment, input signal lines 208a-b to couple with a core or a voltage transformer. For an embodiment, burden resistor circuit 201 is coupled with a core or a voltage transformer through a rectifier, as described herein. A further embodiment includes burden resistor circuit 201 coupled with a core or a voltage transformer through a rectifier and other components for conditioning a signal received from a core. The embodiment illustrated in FIG. 4 also includes output signal lines 210a-b coupled with a monitor. As described herein, output signal lines 210a-b may be coupled with a monitor through one or more conditioning circuits. According to an embodiment, output signal lines 210a-b are coupled with a monitor through a root-mean-square converter configured to convert the output signal generated by a burden resistor circuit 201 to a root-mean-square voltage signal. Output signal lines 210a-b, according to an embodiment, may be a voltage signal or a current signal that is proportional to the input signal received on input signal lines 208a-b.

For an embodiment, resistive elements 202a-c are configured such that the voltage of output signal lines 210a-b varies from approximately 0 to 1 volt. Another embodiment includes resistive elements 202a-c configured such that the voltage of output signal lines 210a-b varies between approximately 0 to 2.5 volts. Yet another embodiment includes resistive elements 202a-c configured such that the voltage of output signal lines 210a-b varies from approximately 2.5 to 5 volts. One skilled in the art would appreciate that output signal lines 210a-b may be designed to have any range of values by varying the value of components in a circuit including the values of resistive elements 202a-c.

Figure 5:
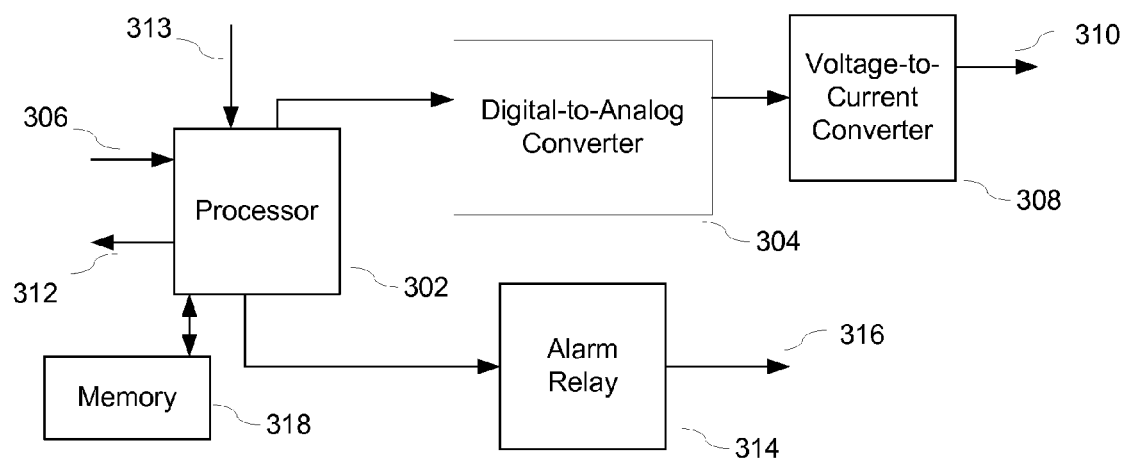
FIG. 5 illustrates a diagram of a monitor circuit for an electrical sensor according to an embodiment.

FIG. 5 illustrates a block diagram of a monitor circuit for an electrical sensor according to an embodiment. A monitor includes, according to an embodiment, a monitor circuit that includes a processor 302. A processor 302 may include, but is not limited to, one or more of a microprocessor, a microcontroller, a digital signal processor, and other processing devices. The processor 302 according to an embodiment is coupled with a digital-to-analog converter 304. For an embodiment, processor 302 receives an output signal from one or more burden resistors as described herein on one or more burden signal inputs 306.

The processor 302, according to an embodiment, determines a magnitude of a current in an electrical conductor passing through a sensing aperture by comparing a value of one or more burden signal inputs 306 to a reference value. Similarly, a processor 302, according to an embodiment, determines a magnitude of an input voltage signal by comparing a value of the one or more burden signal inputs 306 to a reference value. According to an embodiment, a burden signal input 306 is a voltage that is proportional to a magnitude of a current in an electrical conductor passing through a sensor aperture. Another embodiment includes burden signal inputs 306 that is a voltage that is proportional to a magnitude of an input voltage signal. For an embodiment, the burden signal input 306 is in a range from approximately 0 to 5 volts. For another embodiment, a burden signal input 306 is in a range from approximately 0.5 to 4.5 volts. Yet another embodiment includes a burden signal input 306 in a range from approximately 0 to 1 volt.

According to an embodiment, a processor 302 includes an analog-to-digital converter that converts an analog voltage signal generated by a burden resistor circuit and received through of one or more burden signal inputs 306 into a binary number that corresponds to the analog voltage signal. A binary number includes a series of bits that represent or correspond to a value. An embodiment may also include an analog-to-digital converter that is external to a processor 302. In such an embodiment, the binary number is transmitted to a processor 302. According to an embodiment, the processor is configured to multiply a binary number by a multiplication constant. Such a multiplication constant includes, but is not limited to, multiplication constants determined using techniques described herein. For an embodiment, the result of multiplying the binary number by the multiplication constant determines the value of at least one of a magnitude of a current, a magnitude of a voltage, or a magnitude of power depending on whether a binary number corresponds to a measured current, a measured voltage or a measured power value, respectively. According to an embodiment, a processor 302 is configured to multiply a determined current magnitude by a determined voltage magnitude to determine a power magnitude.

According to an embodiment, a processor 302 is configured to use a binary number to determine the magnitude of a current in an electrical conductor passing through a sensor aperture by referencing a current magnitude lookup table stored in a memory. For an embodiment, a processor 302 is configured to use a binary number to determine a magnitude of an input voltage signal by referencing a voltage magnitude lookup table stored in a memory. A processor 302, according to an embodiment references a current magnitude lookup table entry corresponding to a received binary number which includes a current magnitude value that corresponds to a magnitude of the current in an electrical conductor passing through a sensor aperture. For an embodiment, a processor 302 may be configured to use a similar technique for determining a voltage magnitude or power magnitude. For an embodiment, the lookup table is stored in memory internal to the processor 302. According to another embodiment, lookup table is stored in an external memory.

According to an embodiment, a processor 302 is coupled with a digital-to-analog converter 304. A processor 302 outputs a determined magnitude value for a received binary number to a digital-to-analog converter 304. A determined magnitude value may be a magnitude of a current, an input voltage signal, or power depending on the type of input a binary number corresponds to, according to an embodiment. For an embodiment, a magnitude value is outputted as a serial bit stream. According to an embodiment, a processor 302 also provides a clock to digital-to-analog converter 304 that corresponds to the serial bit stream for clocking bits into a digital-to-analog converter 304. A digital-to-analog converter 304 generates an output voltage signal that corresponds to a received digital magnitude value.

As such, a monitor circuit generates an output voltage signal that corresponds to a magnitude of at least one of an input voltage signal, power, and a current in an electrical conductor passing through a sensor aperture. According to an embodiment, a monitor circuit is configured to generate an output voltage signal that varies from approximately 0 to 5 volts. Another embodiment includes a monitor circuit that is configured to generate an output voltage signal that varies from approximately 0 to 10 volts. Other embodiments may be configured to generate an output voltage signal that varies over other voltage ranges.

For an embodiment, a monitor circuit includes a voltage-to-current converter 308 to convert an output voltage signal from a digital-to-analog converter 304 into a corresponding output current signal. A voltage-to-current converter, according to an embodiment, is configured to generate an output current signal from approximately 4 milliamperes to 20 milliamperes, such that each value of the output current signal corresponds to a magnitude of at least one of an input voltage signal, power, and a current in an electrical conductor. For another embodiment the range for the output current signal is approximately 0 milliampere to 20 milliamperes. According to another embodiment, the range for an output current signal is approximately 1 milliampere to 15 milliamperes. Other embodiments are configures to have an output current signal operate over a different range of current values. For an embodiment, a change in an output current signal generated by a monitor is proportional to a change in a signal measured or sensed by an electrical sensor.

For an embodiment, a processor 302 also selects or activates one or more relay(s) or switches in a burden resistor circuit based on a value of a burden signal input received on 306. As described above, a processor 302 may convert a burden signal input 306 received into a binary number. This binary number, according to an embodiment, is used to determine which relays to activate. For an embodiment, processor 302 references a relay-configuration lookup table that includes the settings of the relays that correspond to a received binary number. The relay-configuration lookup table may be stored in memory internal to a processor 302 or external to a processor 302. According to some embodiments, a magnitude lookup table and a relay-configuration lookup table are the same lookup table that has two entries for a given value of a burden signal input 306. One entry in the lookup table is a magnitude value and one entry is for a relay configuration.

Based on the relay configuration retrieved from a lookup table, a processor 302 generates a relay output 312 to select among resistor elements in a burden resistor circuit. According to an embodiment, a relay output 312 may include one or more signal lines. A relay output 312 includes one signal line for each relay or switch used in a burden resistor circuit, according to an embodiment. According to an embodiment, a processor 302 generates a voltage on a signal line to activate or select a relay. For example, a 5 volt signal is generated on relay output 312. Another embodiment includes a processor 302 pulling relay output 312 to ground to activate a relay. Yet another embodiment includes relay output 312 configured as a bus such that a processor 302 sends a command to an address assigned to a relay or switch to activate it.

A processor 302, according to an embodiment, is also configured to receive one or more inputs, such as one or more configuration inputs, that indicate a threshold value and/or a delay value to configure an alarm. According to an embodiment, a processor 302 is coupled with one or more inputs, as described above, through one or more input signal lines 313. For an embodiment, one or more configuration inputs coupled with a processor 302 through one or more input signal lines 313 are configured to generate a signal that corresponds to a position of a switch. For example, a configuration input includes a switch that varies its resistance as its position changes, such as a potentiometer. As such, a configuration input is configured to generate a signal that corresponds to a value based on a resistance of the switch.

According to an embodiment, one or more configuration inputs are configured to generate an input current value that corresponds to a position of a configuration input. For another embodiment, a configuration input is configured to generate an input voltage value that corresponds to a position of a configuration input. According to an embodiment, a configuration input is configured to generate a voltage or a current on one or more input signal lines 313 that correspond to a position or setting of a configuration input. A processor 302, according to an embodiment, determines the position or setting of the configuration input by accessing an input-value lookup table at a location that corresponds to a voltage or a current value on one or more input signal lines 313. An input-value lookup table may be stored in internal memory to processor 302 or memory external to processor 302.

According to another embodiment, the one or more configuration inputs are binary-coded decimal switches. For such an embodiment, a binary-coded decimal switch is configured to output a binary number that corresponds to the position of the switch. For such an embodiment, a processor 302 is configured to receive a binary number of one or more configuration inputs using techniques described herein. For an embodiment, a processor 302 generates a relay output 312 to select among resistor elements in a burden resistor circuit based on one or more inputs. According to an embodiment, one or more binary-coded decimal switches are used to set a trip-point value. As such, a processor 302 is configured to receive a binary number of the one or more binary-coded decimal switches and to generate a relay output 312 that corresponds to the binary number.

For an embodiment of an electrical sensor including three resistive levels in a burden resistor(s), a processor 302 is configured to determine if a binary number that corresponds to a set trip-point value falls within a range of magnitudes that correspond to the first resistance level, the second resistance level, or a third resistance level. Based on this determination, a processor 302 selects the resistance level of a burden resistor circuit using techniques described herein.

According to an embodiment, a processor 302 determines if a binary number is within a range of magnitudes by comparing the binary number to a minimum and/or maximum magnitude of at least one range that corresponds to a resistance level of a burden resistor circuit. If the binary number is determined to be between a minimum and a maximum magnitude for a range that corresponds to a resistance level, a processor 302 selects that resistance level. According to an embodiment, if a binary number is determined to be equal to a minimum magnitude of a range that corresponds to a resistance level, a processor 302 is configured to select a resistance level that corresponds to a range of magnitudes less than that minimum magnitude value. If a binary signal is determined to be equal to a maximum value of a range that corresponds to a resistance level, according to an embodiment, a processor 302 is configured to select a resistance level that corresponds to a range of magnitudes greater than that maximum value. According to an embodiment, a minimum and/or a maximum value for each range is stored in a lookup table stored in a memory. As such, a processor 302, according to an embodiment, accesses a memory to determine a minimum and/or a maximum value for a range used to compare a binary number for configuring a resistance level of a burden resistor circuit.

For an embodiment, a processor 302 is configured to compare one or more binary signals to a burden signal input 306. For an embodiment, a burden signal input 306 is a binary number, as described herein. As such, a processor 302 is configured to compare a binary number from a burden signal input 306 and one or more binary signals from one or more configuration input that set a configuration value of an electrical sensor, including, but not limited to, a trip-point value, a threshold value, and a delay value. According to an embodiment, if a processor 302 determines that a binary number that corresponds to one or more burden signal inputs 306 is greater than the binary number that corresponds to a set trip-point value, the processor 302 activates an alarm using techniques described herein. For an embodiment, if a processor 302 determines that a binary number that corresponds to one or more burden signal inputs 306 is less than the binary number that corresponds to a set trip-point value, the processor 302 activates an alarm using techniques described herein.

Another embodiment includes an electrical sensor configured to set a minimum and a maximum threshold values using techniques described herein. For such an embodiment, one or more configuration inputs may correspond to a minimum threshold value set using one or more switches. Similarly, one or more configuration inputs may correspond to a maximum threshold value set using one or more switches. As such, according to an embodiment, a processor 302 is configured to determine if a binary number that corresponds to one or more burden signal inputs 306 is within a range set by a minimum and a maximum threshold values. If a processor 302, according to an embodiment, determines a binary number that corresponds to one or more burden signal inputs 306 is within a range set by a minimum and a maximum threshold values, the processor 302 may activate an alarm. Alternatively, an embodiment includes a processor 302 configured to activate an alarm if the processor 302 determines a binary number that corresponds to one or more burden signal inputs 306 is outside a range set by a minimum and a maximum threshold values, the processor may activate an alarm. An embodiment also includes comparing a binary number that corresponds to one or more burden input signals 306, as described herein, after the binary number is multiplied by a multiplication constant using techniques descried herein.

According to an embodiment, an electrical sensor includes a configuration input for each place value of a setting, such as a threshold value, a trip-point value, or delay value. For an embodiment, a processor 302 is coupled with three configuration inputs to set a threshold value, a trip-point value, or a delay value: one for the tens place value, one for the hundreds place value, and one for the thousands value. An embodiment includes at least a configuration input configured to set a delay value for an alarm.

A processor 302, according to an embodiment, is also coupled with an alarm such as an alarm relay 314. A processor 302 is configured to activate an alarm relay based on the configuration inputs that set a trip-point value, a threshold value and/or delay value, as described herein. A processor 302 activates an alarm relay 314 upon determining conditions are met based on configuration inputs by generating an alarm relay signal. Such an alarm relay signal may be a voltage, a current, or other signal type. According to an embodiment, processor 302 activates an alarm relay 314 by generating a 5 volt alarm relay signal. Alarm relay 314, according to an embodiment, generates an alarm signal 316 that may be used by a control system to indicate that a current level, a voltage level, or a power level in an electrical conductor has passed a certain threshold, as described herein.

Figure 6:
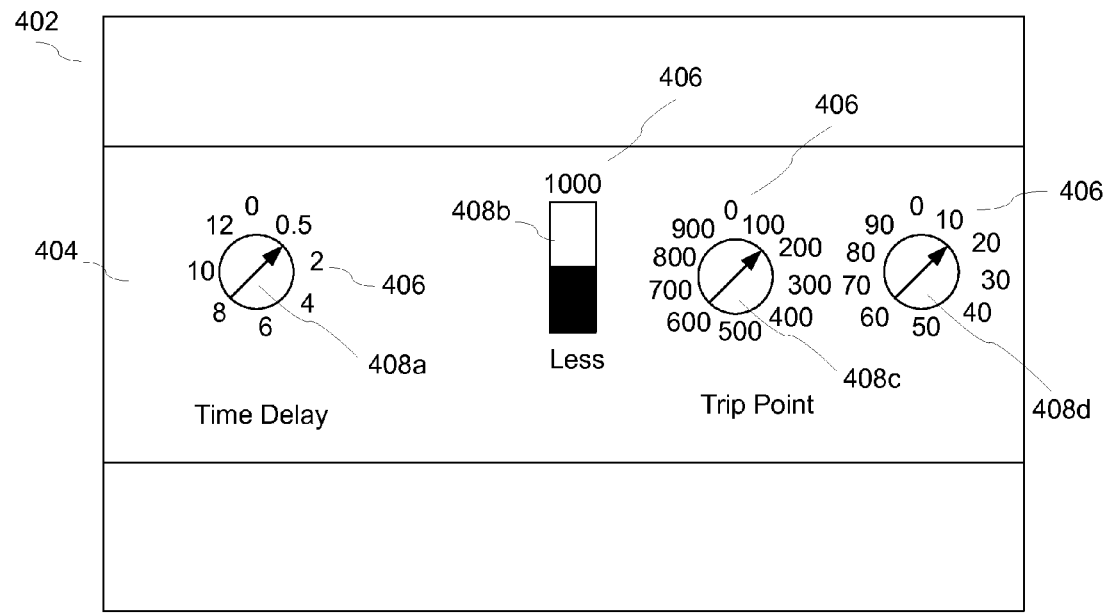
FIG. 6 illustrates a top view of a diagram of an electrical sensor including one or more configuration inputs according to an embodiment.

FIG. 6 illustrates a block diagram of an electrical sensor 402 including one or more configuration inputs according to an embodiment. An electrical sensor 402, according to an embodiment, includes a configuration panel 404 including a plurality of configuration inputs for configuring the operation of an electrical sensor 402. An electrical sensor 402 includes indicators 406, according to an embodiment. According to an embodiment, a configuration panel 404 includes a plurality of configuration inputs such as selectors 408*a-d*. Selectors 408*a-d*, according to an embodiment, set the value of a configuration setting. For example, selector 408*a* illustrated in the FIG. 4 is used to set the delay value and selectors 408*b-d* are used to set the trip-point or threshold value for an alarm. A configuration panel 404 also includes indicators 406 that correspond to a value or a setting that the selectors are set to, according to an embodiment. Indicators 406 are labeled on configuration panel 404 according to an embodiment. An indicator 406 may be any alphanumeric character that represents a value or a setting. Such an indicator 406 may be etched on, drawn on, printed on, or otherwise affixed to an electrical sensor 402. As such, a user would set the value by moving a selector 408*a-d* to point to the indicator of the value desired. Thus, the value of a selector 408*a-d* is set and an electrical sensor 402 determines the value based on a position of a selector 408*a-d* using techniques described herein.

Figure 7:
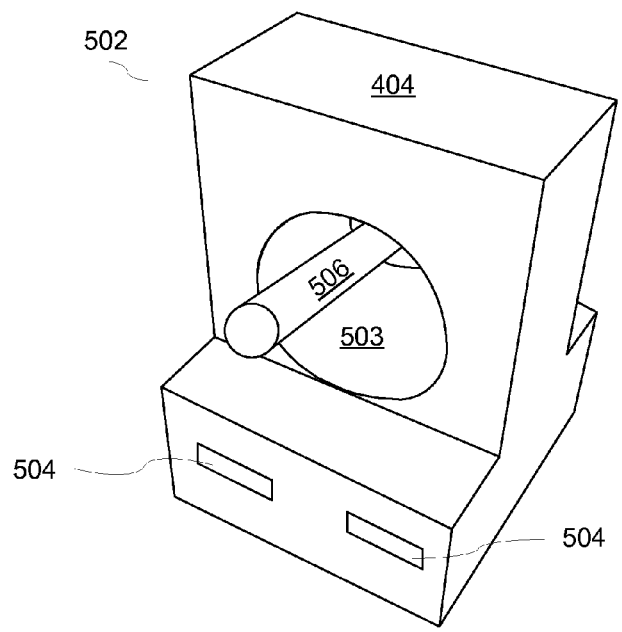
FIG. 7 illustrates a perspective view of a diagram of an electrical sensor according to an embodiment.

FIG. 7 illustrates a perspective view of an electrical sensor 502 that includes a coil for measuring a current according to an embodiment. An electrical sensor 502, according to an embodiment includes a configuration panel 404 to set the operational characteristics of the electrical sensor, as described herein. For an embodiment, sensor aperture 503 is configured to accept an electrical conductor 506 through electrical sensor 502 to enable sensing or measuring a current in the electrical conductor 506. An electrical sensor 502 also includes outputs as described herein, according to an embodiment. For an embodiment, an electrical sensor 502 includes one or more connectors 504 for connecting one or more outputs to other equipment such as a control system or monitor system. In addition, one or more connectors 504, according to an embodiment, include inputs for receiving an input voltage signal to couple with a voltage transformer as described herein. For an embodiment, one or more connectors are configured to receive a voltage used to provide power to components used in an electrical sensor. Connectors 504 include, but are not limited to, keyed connectors, terminal blocks, posts, plug and socket connectors, and other connectors for making an electrical connection.

Figure 8:
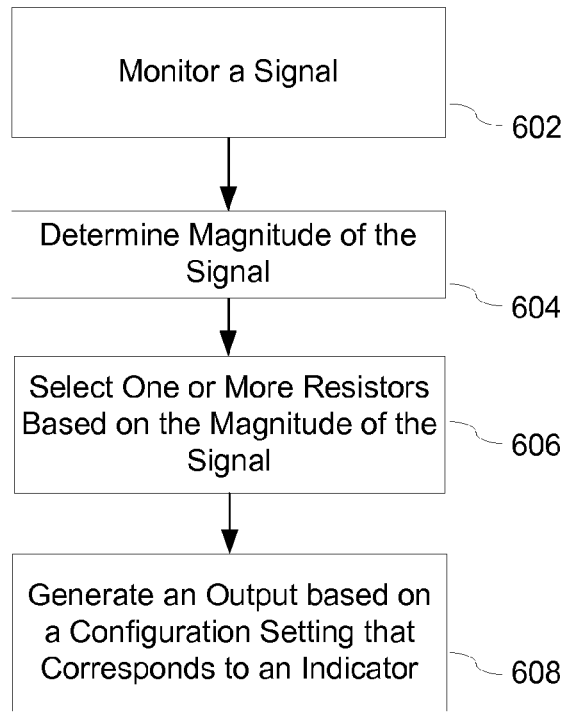
FIG. 8 is a flow diagram of a method for monitoring a signal including selecting a resistance based on a magnitude of a signal according to an embodiment.

FIG. 8 is a flow diagram of a method for monitoring a signal including selecting a resistance based on a magnitude of a signal according to an embodiment. At block 602, the method includes monitoring a signal using techniques as described herein. At block 604, the method determines a magnitude of a signal using techniques described herein. The magnitude of a signal corresponding to at least one of a voltage level, a current level, or a power level. The method also selects one or more resistors based on the magnitude of the signal using techniques as described herein. In addition, a method generates an output based on a configuration setting that corresponds to one or more indicator at block 608 using techniques described herein. According to an embodiment, a configuration setting includes, but is not limited to, a trip-point value, a delay value, and a threshold value. As described herein, a value of a configuration setting is determined based on a position of a switch relative to one or more indicators. For some embodiments, the method generates an output based on a plurality of configuration settings.

Figure 9:
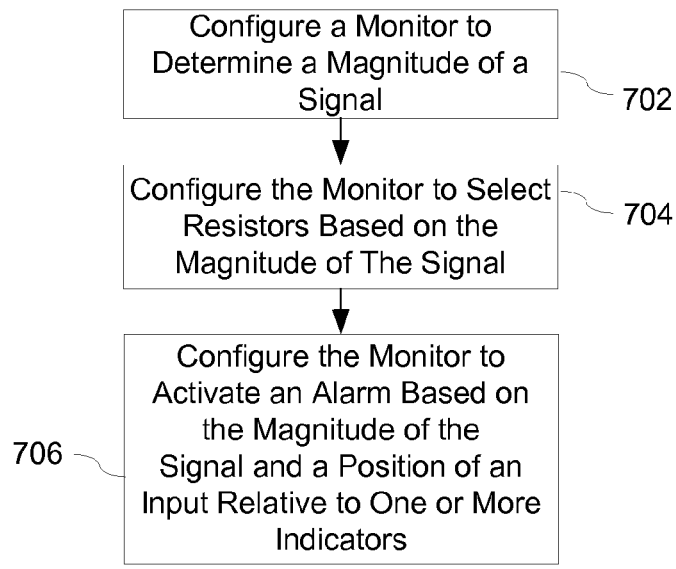
FIG. 9 is a flow diagram of a method for configuring a monitor including configuring a monitor to select a resistance based on a magnitude of a signal according to an embodiment.

FIG. 9 is a flow diagram of a method for configuring a monitor including configuring a monitor to select a resistance based on a magnitude of a signal according to an embodiment. According to an embodiment, the method includes, at block 702, configuring a monitor to determine a magnitude of a signal using techniques described herein. At block 704, the method configures a monitor to select resistors based on the magnitude of a signal using techniques described herein. The method also includes configuring the monitor to activate an alarm based on the magnitude of a signal and a position of one or more configuration inputs relative to one or more indicators using techniques described herein.

Figure 10:
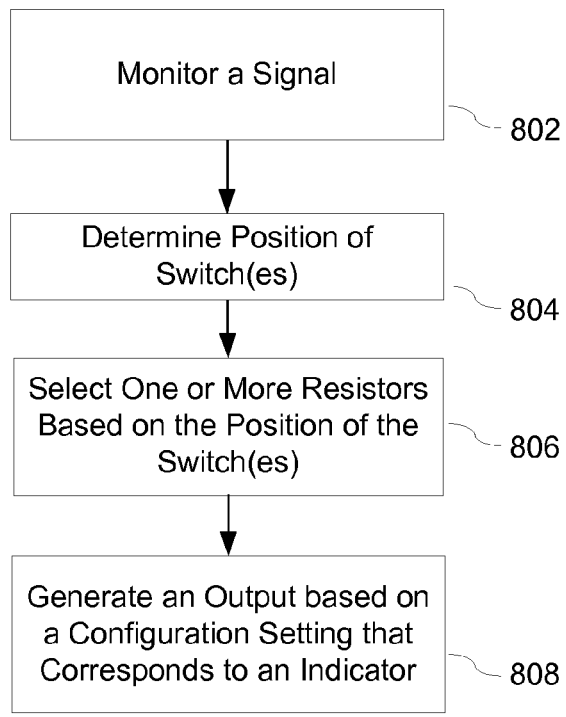
FIG. 10 is a flow diagram of a method for monitoring a signal including selecting a resistance based on a position of a switch according to an embodiment.

FIG. 10 is a flow diagram of a method for monitoring a signal including selecting a resistance based on a position of a switch according to an embodiment. At block 802, the method includes monitoring a signal according to an embodiment, using techniques described herein. The method, at block 804 determines a position of one or more switches using techniques described herein. As described herein, a position of one or more switches corresponds to a value of a configuration setting including, but not limited to, a trip-point value, a delay value, and a threshold value. At block 806, the method selects one or more resistors based on a position of one or more switches, using techniques described herein. According to an embodiment, the method selects one or more resistors based on a position of one or more switches that set a trip-point value. The method, at block 808, generates an output based on one or more configuration settings that corresponds to one or more indicators. As described herein, a value of a configuration setting is determined based on a position of a switch to one or more indicators. For an embodiment, the method generates an output, such as an alarm, using techniques as described herein.

Figure 11:
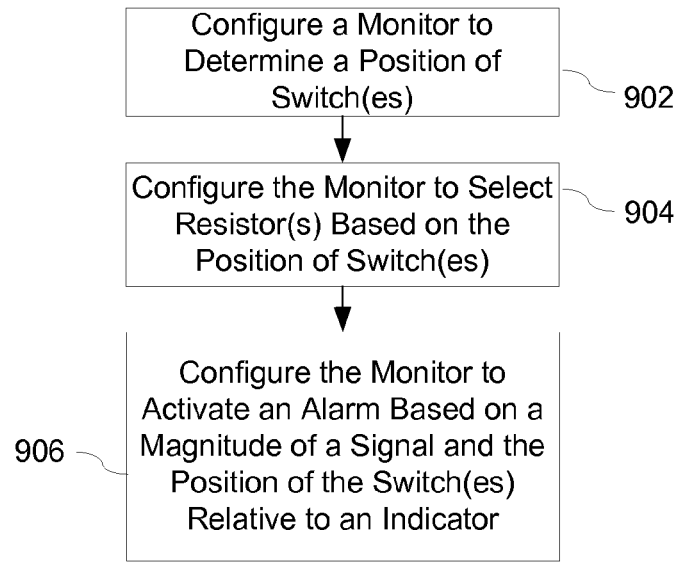
FIG. 11 is a flow diagram of a method for configuring a monitor including configuring a monitor to select a resistance based on a position of a switch according to an embodiment.

FIG. 11 illustrates a flow diagram of a method for configuring a monitor including configuring a monitor to select a resistance based on a position of a switch according to an embodiment. At block 902, the method includes configuring a monitor to determine a position of one or more switches using techniques as described herein. According to an embodiment, a monitor, such as embodiments described herein, may be included in a voltage sensor, a current sensor, or a power sensor. The method, at block 904, configures a monitor to select one or more resistors based on a position of one or more switches as described herein. According to an embodiment, a monitor may select one or more resistors of a burden resistor(s) of an electrical sensor as described herein. At block 906, the method configures a monitor to activate an alarm based on a magnitude of a signal and a position of one or more switches relative to one or more indicators as described herein. According to an embodiment, configuring a monitor includes one of or a combination of programming a processor, loading instructions or code into a processor or memory, connecting components, and otherwise arranging components.

In the foregoing specification, specific exemplary embodiments of the invention have been described. It will, however, be evident that various modifications and changes may be made thereto. The specification and drawings are, accordingly, to be regarded in an illustrative rather than a restrictive sense.

What is claimed is:

1. An electrical sensor comprising:
an electrical signal input configured to receive an electrical signal, said electrical signal input includes a core configured to define a sensing aperture and said core is configured to generate a current that corresponds to said electrical signal;
an alarm;
one or more inputs configured to set a configuration value corresponding to one or more values labeled on a configuration panel on the electrical sensor;
a monitor coupled with said electrical signal input, said alarm, and said one or more inputs, said monitor configured to determine a characteristic of said electrical signal received on said electrical signal input and said monitor configured to activate said alarm based on said configuration value set by said one or more inputs and said characteristic of said electrical signal; and
an output coupled with said monitor, said characteristic is a determined current of said electrical signal input, and said monitor is configured to generate an output signal corresponding to a magnitude of said determined current of said electrical signal.

2. The electrical sensor of claim 1, wherein said monitor includes a processor coupled with a plurality of resistors, said processor configured to select at least one of said plurality of resistors responsive to said characteristic of said electrical signal.

3. The electrical sensor of claim 1, wherein said alarm is a control signal.

4. The electrical sensor of claim 1, wherein said one or more inputs includes a selector configured to set a tens place value of said configuration value corresponding to said one or more values on the electrical sensor.

5. The electrical sensor of claim 4, wherein said one or more inputs includes a selector configured to set the hundreds place value of said configuration value corresponding to said one or more values on the electrical sensor.

6. The electrical sensor of claim 5, wherein said one or more inputs includes a selector configured to set the thousands place value of said configuration value corresponding to said one or more values on the electrical sensor.

7. The electrical sensor of claim 5, wherein said one or more inputs includes a selector configured to set the thousands place value of said trip point corresponding to said one or more values on the electrical sensor.

8. The electrical sensor of claim 4 further comprising a delay input configured to select a delay value corresponding to one or more values on the electrical sensor.

9. The electrical sensor of claim 5, wherein said monitor is coupled with said delay input and said monitor is configured to delay activation of said alarm for a period of time corresponding to said delay value.

10. The electrical sensor of claim 1 further comprising a hall-effect sensor coupled with said core.

11. The electrical sensor of claim 1, wherein said electrical signal input further includes a voltage transformer configured to generate a first voltage that corresponds to said electrical signal.

12. The electrical sensor of claim 1 further comprising a plurality of burden resistors coupled with said monitor, said monitor further is configured to select among said plurality of burden resistors based on said configuration value corresponding to one or more values on the electrical sensor.

13. An apparatus for measuring one or more electrical characteristic comprising:
an electrical signal input configured to receive an electrical signal, said electrical signal input includes a core configured to define a sensing aperture and said core is configured to generate a current that corresponds to said electrical signal;
a plurality of burden resistors coupled with said electrical signal input;
at least one input configured to set a configuration value corresponding to one or more values labeled on a configuration panel on the apparatus;
a monitor circuit coupled with said plurality of burden resistors and coupled with said at least one input, said monitor configured to determine a characteristic of said electrical signal, and said monitor configured to select at least one burden resistor of said plurality of burden resistors, and
an output coupled with said monitor circuit, said characteristic is a determined current of said electrical signal input, and said monitor circuit is configured to generate an output signal corresponding to a magnitude of said determined current of said electrical signal.

14. The electrical sensor of claim 13, wherein said electrical signal input further includes a voltage transformer configured to generate a first voltage that corresponds to said electrical signal .

15. The apparatus of claim 13 further comprising an alarm circuit, wherein said configuration value is a trip point corresponding to said one or more values, and said monitor is further configured to activate said alarm based on said configuration value selected by said at least one input.

16. The apparatus of claim 13, wherein said monitor includes a processor coupled with said plurality of resistors, said processor configured to select said at least one of said plurality of resistors based on said determined characteristic of said electrical signal.

17. The apparatus of claim 16, wherein said processor is configured to select at least one of said plurality of resistors through one or more relays configured to add said plurality of resistors in parallel.

18. The apparatus of claim 13, wherein said monitor is configured to select at least one burden resistor of said plurality of burden resistors based on said configuration value corresponding to said one or more indicators.

19. The apparatus of claim 13, wherein said at least an input includes a first selector configured to set a tens place value of said configuration value that corresponds to said one or more values and a second selector configured to set a hundreds place value of said configuration value that corresponds to said one or more values.

20. A method comprising:
configuring a monitor of an electrical sensor to determine a characteristic of an electrical signal, said electrical sensor including a core configured to define a sensing aperture and said core is configured to generate a current that corresponds to said electrical signal;
configuring said monitor to select from a plurality of resistors coupled with said monitor based on said characteristic of an electrical signal;
configuring said monitor to generate an output corresponding to said characteristic of said electrical signal, said characteristic is a determined current and said output corresponds to a magnitude of said determined current of said electrical signal; and
configuring said monitor to activate an alarm coupled with said monitor based on said characteristic of an electrical signal and a position of one or more inputs relative to one or more values labeled on a configuration panel on the electrical sensor.

21. The method of claim 20 wherein configuring said monitor of said electrical sensor to determine a characteristic of said electrical signal includes configuring said monitor to determine a current of said electrical signal.

22. The method of claim 20 wherein configuring said monitor of said electrical sensor to determine a characteristic of said electrical signal includes configuring said monitor to determine a voltage of said electrical signal.

23. The method of claim 20 wherein configuring said monitor of said electrical sensor to determine a characteristic of said electrical signal includes configuring said monitor to determine a power of said electrical signal.

24. A process for sensing a characteristic of an electrical signal, the process comprising:
monitoring said electrical signal received on an electrical signal input, said electrical signal input includes a core configured to define a sensing aperture and said core is configured to generate a current that corresponds to said electrical signal;
determining a characteristic of said electrical signal;
selecting one or more resistors based on said characteristic of said electrical signal;
generating an output corresponding to said characteristic of said electrical signal, said characteristic is a determined current of said electrical signal input, and said output corresponds to a magnitude of said determined current of said electrical signal; and
activating an alarm based on a configuration value set by one or more inputs configured to set a configuration value corresponding to one or more values labeled on a configuration panel of an electrical sensor and said characteristic of said electrical signal.

* * * * *